(12) United States Patent
Zhao

(10) Patent No.: US 11,508,848 B2
(45) Date of Patent: Nov. 22, 2022

(54) SEMICONDUCTOR DEVICE AND METHOD FOR MANUFACTURING THE SAME

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Meng Zhao, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 198 days.

(21) Appl. No.: 17/093,877

(22) Filed: Nov. 10, 2020

(65) Prior Publication Data

US 2021/0083093 A1 Mar. 18, 2021

Related U.S. Application Data

(62) Division of application No. 16/702,036, filed on Dec. 3, 2019, now Pat. No. 10,861,976, which is a division
(Continued)

(30) Foreign Application Priority Data

Dec. 11, 2017 (CN) .......................... 201711306913.6

(51) Int. Cl.
*H01L 29/78* (2006.01)
*H01L 29/51* (2006.01)
(Continued)

(52) U.S. Cl.
CPC ...... *H01L 29/785* (2013.01); *H01L 21/28105* (2013.01); *H01L 29/165* (2013.01);
(Continued)

(58) Field of Classification Search
CPC ................................................ H01L 29/66545
See application file for complete search history.

(56) References Cited

U.S. PATENT DOCUMENTS

2016/0380082 A1\* 12/2016 Yu ..................... H01L 21/32134
438/283
2019/0035933 A1\* 1/2019 Lo ....................... H01L 29/0847

\* cited by examiner

*Primary Examiner* — Yu-Hsi D Sun
(74) *Attorney, Agent, or Firm* — Crowell & Moring, L.L.P.

(57) ABSTRACT

The present disclosure teaches semiconductor devices and methods for manufacturing the same. Implementations of the semiconductor device may include: a semiconductor substrate; a semiconductor fin positioned on the semiconductor substrate; and a gate structure positioned on the semiconductor fin, where the gate structure includes a gate dielectric layer on a part of a surface of the semiconductor fin and a gate on the gate dielectric layer; where the gate includes a metal gate layer on the gate dielectric layer and a semiconductor layer on a side surface of at least one side of the metal gate layer; and where the semiconductor layer includes a dopant, where a conductivity type of the dopant is the opposite of a conductivity type of the semiconductor fin. The present disclosure can improve a work function of the device, thereby improving a current characteristic of the device during a working process, reducing the short channel effect (SCE), and lowering a leakage current.

6 Claims, 8 Drawing Sheets

Related U.S. Application Data of application No. 16/106,625, filed on Aug. 21, 2018, now Pat. No. 10,522,685.

(51) Int. Cl.
*H01L 29/66* (2006.01)
*H01L 29/812* (2006.01)
*H01L 29/165* (2006.01)
*H01L 21/28* (2006.01)
*H01L 29/49* (2006.01)

(52) U.S. Cl.
CPC ........ *H01L 29/4983* (2013.01); *H01L 29/517* (2013.01); *H01L 29/6653* (2013.01); *H01L 29/66545* (2013.01); *H01L 29/66795* (2013.01); *H01L 29/812* (2013.01)

```
┌─────────────────────────────────────────────────────────────┐
│ Provide a semiconductor structure, where the semiconductor  │
│ structure includes: a semiconductor substrate; a            │
│ semiconductor fin on the semiconductor substrate; and a     │
│ pseudo gate structure on the semiconductor fin, where the   │         S101
│ pseudo gate structure includes a gate dielectric layer on a │
│ part of a surface of the semiconductor fin and a            │
│ semiconductor layer on the gate dielectric layer, and the   │
│ semiconductor layer includes a dopant, a conductivity type  │
│ of the dopant being opposite to a conductivity type of the  │
│ semiconductor fin                                           │
└─────────────────────────────────────────────────────────────┘
                              │
                              ▼
┌─────────────────────────────────────────────────────────────┐
│ Form a spacer layer on each side surface of two sides of    │         S102
│ the semiconductor layer                                     │
└─────────────────────────────────────────────────────────────┘
                              │
                              ▼
┌─────────────────────────────────────────────────────────────┐
│ Form an inter-layer dielectric layer surrounding the spacer │
│ layer and the pseudo gate structure, where an upper surface │         S103
│ of the semiconductor layer is exposed on the inter-layer    │
│ dielectric layer                                            │
└─────────────────────────────────────────────────────────────┘
                              │
                              ▼
┌─────────────────────────────────────────────────────────────┐
│ Partially etch the semiconductor layer to remove a part of  │
│ the semiconductor layer to form an opening on which the     │
│ gate dielectric layer is exposed, where a remaining part of │         S104
│ the semiconductor layer is on a side surface of the spacer  │
│ layer                                                       │
└─────────────────────────────────────────────────────────────┘
                              │
                              ▼
┌─────────────────────────────────────────────────────────────┐
│ Fill the opening with a metal gate layer                    │         S105
└─────────────────────────────────────────────────────────────┘
```

FIG. 1

SEMICONDUCTOR DEVICE AND METHOD FOR MANUFACTURING THE SAME

RELATED APPLICATIONS

The present application is a divisional of U.S. application Ser. No. 16/702,036, filed Dec. 3, 2019, which is a divisional of U.S. application Ser. No. 16/106,625, filed Aug. 21, 2018 (now patented as U.S. Pat. No. 10,522,685), which claims priority to Chinese Patent Appln. No. 201711306913.6, filed Dec. 11, 2017, the entirety of each are incorporated by reference.

BACKGROUND

Technical Field

The present disclosure relates to the field of semiconductor technologies, and in particular, to a semiconductor device and a method for manufacturing the same.

Related Art

Presently, as semiconductor devices gradually become smaller, a short channel effect (SCE) becomes a more serious issue. Therefore, to improve the SCE of core devices, ultra-shallow junctions and abrupt junctions are currently constructed.

To improve the performance of devices, one direction of next-generation technology is to use fin field-effect transistor (FinFET) devices, which can relieve the SCE. However, to meet requirements of FinFET devices, the performance of devices and controlling of the SCE need to be balanced. This has become a challenging problem that technical personnel have made significant efforts to address. For example, a morphology of a lightly doped drain (LDD) region and a halo doping region can be optimized using a co-implantation process of amorphization implantation, the stress effect, or the like, thereby improving a performance of a device.

However, the foregoing measures have had a limited effect in improving the performance of a device. The FinFET device still has the SCE to some extent, and has a strong leakage current, and a current characteristic of the device during a working process is poor. In addition, a smaller size of an existing device indicates more obvious inconformity between an edge part and a middle part of a metal gate, causing the edge effect. That is, a gate controlling capability of the edge part of the metal gate is weaker than a gate controlling capability of the middle part of the metal gate.

SUMMARY

Problems exist in the prior art, and therefore, a new technical solution is put forward to address these problems.

One object of implementations of the present disclosure is to provide a structure of a semiconductor device that improves a work function of the device, thereby improving a current characteristic of the device during a working process, reducing the SCE, and lowering a leakage current.

In a first aspect of the present disclosure, a semiconductor device is provided. The semiconductor device may include: a semiconductor substrate; a semiconductor fin positioned on the semiconductor substrate; and a gate structure positioned on the semiconductor fin, where the gate structure includes a gate dielectric layer on a part of a surface of the semiconductor fin and a gate on the gate dielectric layer; the gate includes a metal gate layer on the gate dielectric layer and a semiconductor layer on a side surface of at least one side of the metal gate layer; and the semiconductor layer includes a dopant, where a conductivity type of the dopant is the opposite of a conductivity type of the semiconductor fin.

In some implementations, the conductivity type of the semiconductor fin is N-type, the conductivity type of the dopant is P-type, and the dopant includes boron; or the conductivity type of the semiconductor fin is P-type, the conductivity type of the dopant is N-type, and the dopant includes phosphorus or arsenic.

In some implementations, a doping density of the dopant ranges from $1 \times 10^{20}$ atoms/cm$^3$ to $1 \times 10^{21}$ atoms/cm$^3$.

In some implementations, the semiconductor layer is located on each side surface of two sides of the metal gate layer.

In some implementations, a material of the semiconductor layer includes polysilicon or amorphous silicon.

In some implementations, the semiconductor device further includes: a spacer layer on each side surface of two sides of the gate structure; and an inter-layer dielectric layer surrounding the spacer layer and the gate structure.

In forms of the foregoing implementations, the semiconductor device includes the doped semiconductor layer on the side surface of at least one side of the metal gate layer, and the conductivity type of the dopant included in the semiconductor layer is the opposite of the conductivity type of the semiconductor fin. This can improve a work function of the device, thereby improving a current characteristic of the device during a working process, reducing the SCE, and lowering a leakage current.

In a second aspect of the present disclosure, a semiconductor device is provided. The semiconductor device may include: a semiconductor substrate; a semiconductor fin positioned on the semiconductor substrate; and a gate structure positioned on the semiconductor fin, where the gate structure includes a gate dielectric layer on a part of a surface of the semiconductor fin and a gate on the gate dielectric layer; the gate includes a metal gate layer on the gate dielectric layer and a metal silicide layer on a side surface of at least one side of the metal gate layer; and the metal silicide layer includes a dopant, where a conductivity type of the dopant being is the opposite of a conductivity type of the semiconductor fin.

In some implementations, the conductivity type of the semiconductor fin is N-type, the conductivity type of the dopant is P-type, and the dopant includes boron; or the conductivity type of the semiconductor fin is P-type, the conductivity type of the dopant is N-type, and the dopant includes phosphorus or arsenic.

In some implementations, a doping density of the dopant ranges from $1 \times 10^{20}$ atoms/cm$^3$ to $1 \times 10^{21}$ atoms/cm$^3$.

In some implementations, the metal silicide layer is located on each side surface of two sides of the metal gate layer.

In some implementations, a material of the metal silicide layer includes nickel silicide (NiSi).

In some implementations, the semiconductor device further includes: a spacer layer on each side surface of two sides of the gate structure; and an inter-layer dielectric layer surrounding the spacer layer and the gate structure.

In forms of the foregoing implementations, the semiconductor device includes the metal silicide layer on the side surface of at least one side of the metal gate layer, and the conductivity type of the dopant included in the metal silicide layer is the opposite of the conductivity type of the semi-conductor fin. This can improve a work function of the device, thereby improving a current characteristic of the device during a working process, reducing the SCE, and lowering a leakage current.

In a third aspect of the present disclosure, a method for manufacturing a semiconductor device is provided. The method may include: providing a semiconductor structure, where the semiconductor structure includes a semiconductor substrate; a semiconductor fin positioned on the semiconductor substrate; and a pseudo gate structure positioned on the semiconductor fin, where the pseudo gate structure includes a gate dielectric layer positioned on a part of a surface of the semiconductor fin and a semiconductor layer on the gate dielectric layer, and the semiconductor layer includes a dopant, where a conductivity type of the dopant is the opposite of a conductivity type of the semiconductor fin; forming a spacer layer on each side surface of two sides of the semiconductor layer; forming an inter-layer dielectric layer surrounding the spacer layer and the pseudo gate structure, where an upper surface of the semiconductor layer is exposed on the inter-layer dielectric layer; partially etching the semiconductor layer to remove a part of the semiconductor layer to form an opening on which the gate dielectric layer is exposed, where a remaining part of the semiconductor layer is on a side surface of the spacer layer; and filling the opening with a metal gate layer.

In some implementations, the conductivity type of the semiconductor fin is N-type, the conductivity type of the dopant is P-type, and the dopant includes boron; or the conductivity type of the semiconductor fin is P-type, the conductivity type of the dopant is N-type, and the dopant includes phosphorus or arsenic.

In some implementations, a doping density of the dopant ranges from $1 \times 10^{20}$ atoms/cm$^3$ to $1 \times 10^{21}$ atoms/cm$^3$.

In some implementations, the remaining part of the semiconductor layer is located on each side surface of two sides of the metal gate layer.

In some implementations, a material of the semiconductor layer includes polysilicon or amorphous silicon.

In some implementations, the method further includes: before filling the opening with a metal gate layer, metalizing the remaining part of the semiconductor layer to form a metal silicide layer.

In some implementations, a material of the metal silicide layer includes NiSi.

In forms of the foregoing manufacturing method, the semiconductor layer is partially etched to remove the part of the semiconductor layer so as to form the opening on which the gate dielectric layer is exposed. Subsequently, the opening is filled with the metal gate layer so that the formed semiconductor device includes the doped semiconductor layer on the side surface of at least one side of the metal gate layer. This can improve a work function of the device, thereby improving a current characteristic of the device during a working process, reducing the SCE, and lowering a leakage current.

Further, the remaining part of the semiconductor layer is metalized to form the metal silicide layer so that the work function of the device can be further improved, thereby further improving the current characteristic of the device during a working process, reducing the SCE, and lowering the leakage current.

Exemplary embodiments and implementations of the present disclosure are described in detail with reference to the accompanying drawings, and other features and advantages of the present disclosure will become more clear.

BRIEF DESCRIPTION OF THE DRAWINGS

The accompanying drawings forming a part of the specification describe embodiments and implementations of the present disclosure, and are used together with the specification to explain the principles of the present disclosure.

Referring to the accompanying drawings, the present disclosure can be understood more clearly according to the detailed description below, where:

FIG. 1 is a flowchart of a method for manufacturing a semiconductor device;

DETAILED DESCRIPTION

Various exemplary embodiments and implementations of the present disclosure are described in detail with reference to the accompanying drawings herein. It should be noted that, unless otherwise specifically stated, the relative arrangement of components and steps, numerical expressions, and values described in these embodiments and implementations do not limit the scope of the present disclosure.

In addition, it should be understood that, for ease of description, the sizes of various parts shown in the accompanying drawings are not drawn according to an actual proportional relation.

The following description of at least one exemplary embodiment or implementation is merely illustrative and should in no way serve as a limitation to the disclosure and application or use thereof.

Technologies, methods, and devices known to a person of ordinary skill in the related art may not be discussed in detail, but the technologies, methods, and devices should be considered as a part of the authorized specification in appropriate cases.

In all of the examples shown and discussed herein, any specific value should be interpreted merely as an example, rather than a limitation. Therefore, other examples of the exemplary embodiments and implementations may have different values.

It should be noted that, similar reference numbers and letters represent similar terms in the following accompanying drawings, and therefore, an item does not need to be further discussed in subsequent accompanying drawings once the item is defined in an accompanying drawing.

FIG. 1 is a flowchart of one form of a method for manufacturing a semiconductor device. FIG. 2 to FIG. 8 are exemplary cross sectional views of structures in several stages of a process of manufacturing the semiconductor device. Implementations of a process of manufacturing a semiconductor device are described in detail below with reference to FIG. 1 and FIG. 2 to FIG. 8.

As shown in FIG. 1, in step S101, a semiconductor structure is provided, where the semiconductor structure includes: a semiconductor substrate; a semiconductor fin on the semiconductor substrate; and a pseudo gate structure on the semiconductor fin. The pseudo gate structure includes a gate dielectric layer on a part of a surface of the semiconductor fin and a semiconductor layer on the gate dielectric layer, and the semiconductor layer includes a dopant, where a conductivity type of the dopant is the opposite of a conductivity type of the semiconductor fin.

Figure 2:
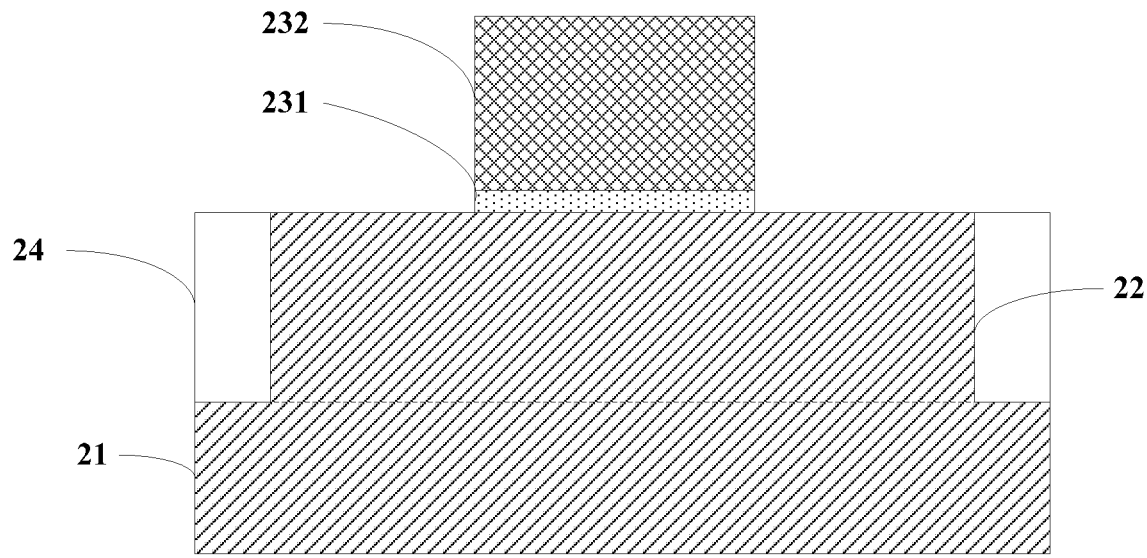
FIG. 2 is an exemplary cross sectional view of a structure in a stage of a process of manufacturing a semiconductor device.

FIG. 2 is an exemplary cross sectional view of a structure in step S101 in an implementation of a process of manufacturing the semiconductor device. As shown in FIG. 2, a semiconductor structure is provided. The semiconductor structure may include: a semiconductor substrate (for example, a silicon substrate) 21; a semiconductor fin (for example, a silicon fin) 22 on the semiconductor substrate 21; and a pseudo gate structure on the semiconductor fin 22. The pseudo gate structure may include a gate dielectric layer (for example, silicon oxide) 231 on a part of a surface of the semiconductor fin 22, and a semiconductor layer 232 on the gate dielectric layer 231. For example, a material of the semiconductor layer 232 may include polysilicon, amorphous silicon, or the like. The semiconductor layer 232 includes a dopant (that is, the semiconductor layer is a doped semiconductor layer), and a conductivity type of the dopant is opposite to a conductivity type of the semiconductor fin 22.

In some implementations, the conductivity type of the semiconductor fin 22 may be N-type (that is, a to-be-formed semiconductor device may be a P-channel metal oxide semiconductor (PMOS) device), and the conductivity type of the dopant may be P-type. For example, the dopant may include boron. In other implementations, the conductivity type of the semiconductor fin 22 may be P-type (that is, a to-be-formed semiconductor device may be an N-channel metal oxide semiconductor (NMOS) device), and the conductivity type of the dopant may be N-type. For example, the dopant may include phosphorus or arsenic.

In some implementations, a doping density of the dopant may range from $1\times10^{20}$ atoms/cm$^3$ to $1\times10^{21}$ atoms/cm$^3$. For example, the doping density of the dopant may be $3\times10^{20}$ atoms/cm$^3$, $5\times10^{20}$ atoms/cm$^3$, or $8\times10^{20}$ atoms/cm$^3$.

Optionally, as shown in FIG. 2, the semiconductor structure may further include a groove isolation portion 24 on the semiconductor substrate 21 and surrounding the semiconductor fin 22. The groove isolation portion 24 may include a groove surrounding the semiconductor fin 22 and a groove insulation material layer filling the groove. Optionally, the semiconductor structure may further include an LDD region (not shown in the figure) formed in the semiconductor fin.

It should be noted that, a dotted line in FIG. 2 is merely for ease of showing different structure parts (for example, the semiconductor substrate and the semiconductor fin), and the dotted line does not necessarily exist. Dotted lines in the following accompanying drawings have similar definitions.

Returning to FIG. 1, in step S102, a spacer layer is formed on each side surface of two sides of the semiconductor layer.

Figure 3:
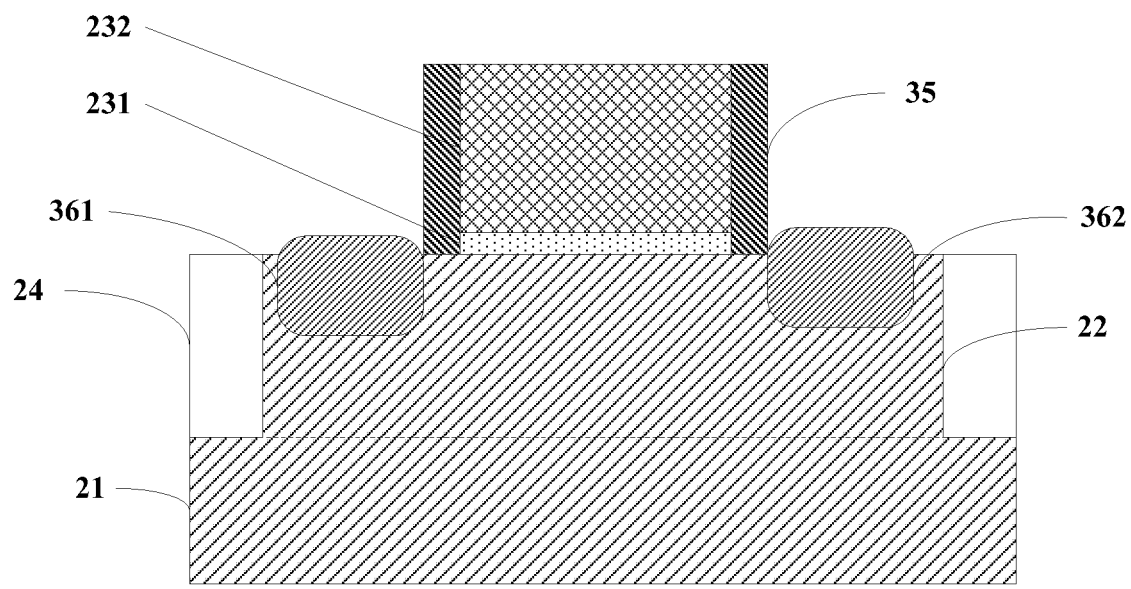
FIG. 3 is an exemplary cross sectional view of a structure in a stage of a process of manufacturing a semiconductor device.

FIG. 3 is an exemplary cross sectional view of a structure in step S102 in an implementation of a process of manufacturing a semiconductor device. As shown in FIG. 3, a spacer layer 35 is formed on each side surface of two sides of the semiconductor layer 232. As shown in FIG. 3, the spacer layer 35 includes two parts that are respectively on the side surfaces of the two sides of the semiconductor layer 232. For example, a material of the spacer layer 35 may include silicon oxide and/or silicon nitride and/or the like.

Optionally, the method may further include: forming, respectively on two sides of the pseudo gate structure by using an epitaxial growth process, a source 361 and a drain 362 that are at least partially located in the semiconductor fin. The spacer layer 35 separately isolates the source 361 and the drain 362 from the semiconductor layer 232. The conductivity type of the dopant of the semiconductor layer 232 is the same as conductivity types of the source 361 and the drain 362. In some implementations, a multilayer spacer layer may be formed in a process of forming the spacer layer, thereby increasing the distance between the source/drain and a gate and reducing parasitic capacitance between the source/drain and the gate.

Returning to FIG. 1, in step S103, an inter-layer dielectric layer surrounding the spacer layer and the pseudo gate structure is formed, where an upper surface of the semiconductor layer is exposed on the inter-layer dielectric layer.

Figure 4:
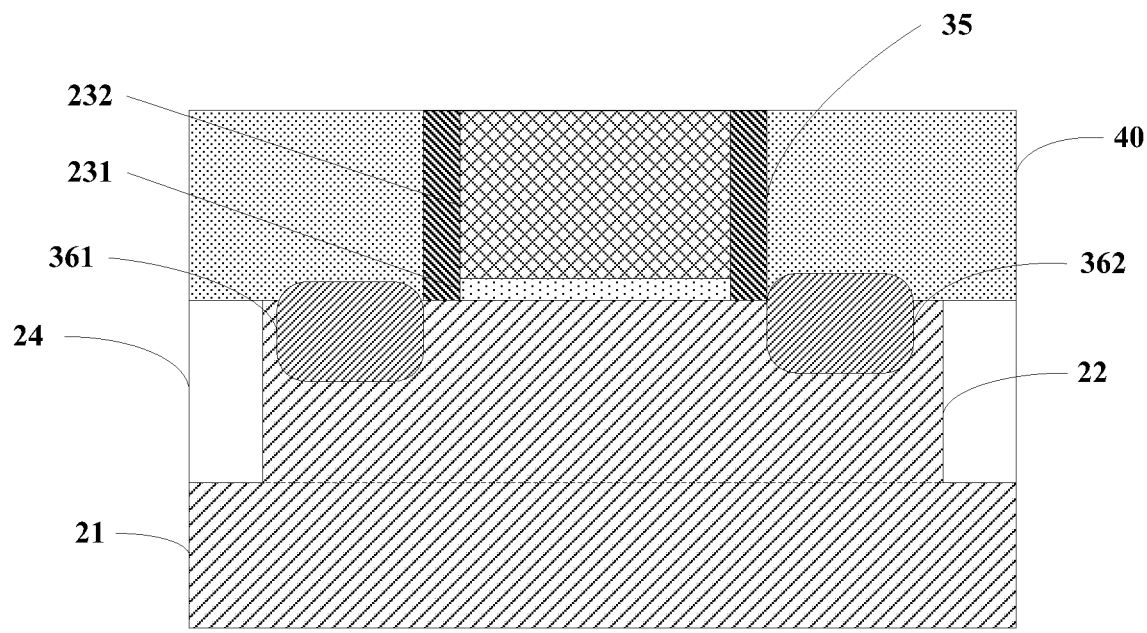
FIG. 4 is an exemplary cross sectional view of a structure in a stage of a process of manufacturing a semiconductor device.

FIG. 4 is an exemplary cross sectional view of a structure in step S103 in an implementation of a process of manufacturing a semiconductor device. As shown in FIG. 4, in step S103, an inter-layer dielectric layer 40 surrounding the spacer layer 35 and the pseudo gate structure is formed, and an upper surface of the semiconductor layer 232 is exposed on the inter-layer dielectric layer 40. For example, a material of the inter-layer dielectric layer 40 may include silicon oxide. For example, the inter-layer dielectric layer may be deposited on the structure shown in FIG. 3 and planarization (for example, chemical mechanical planarization (CMP)) is performed on the inter-layer dielectric layer to expose the upper surface of the semiconductor layer 232.

In some implementations, a contact etch stop layer (CESL) (not shown in the figure) may be deposited on the semiconductor structure on which the source and the drain have been epitaxially grown, and subsequently, the inter-layer dielectric layer is deposited.

Returning to FIG. 1, in step S104, the semiconductor layer is partially etched to remove a part of the semiconductor layer to form an opening on which the gate dielectric layer is exposed, where a remaining part of the semiconductor layer is on a side surface of the spacer layer.

Figure 5:
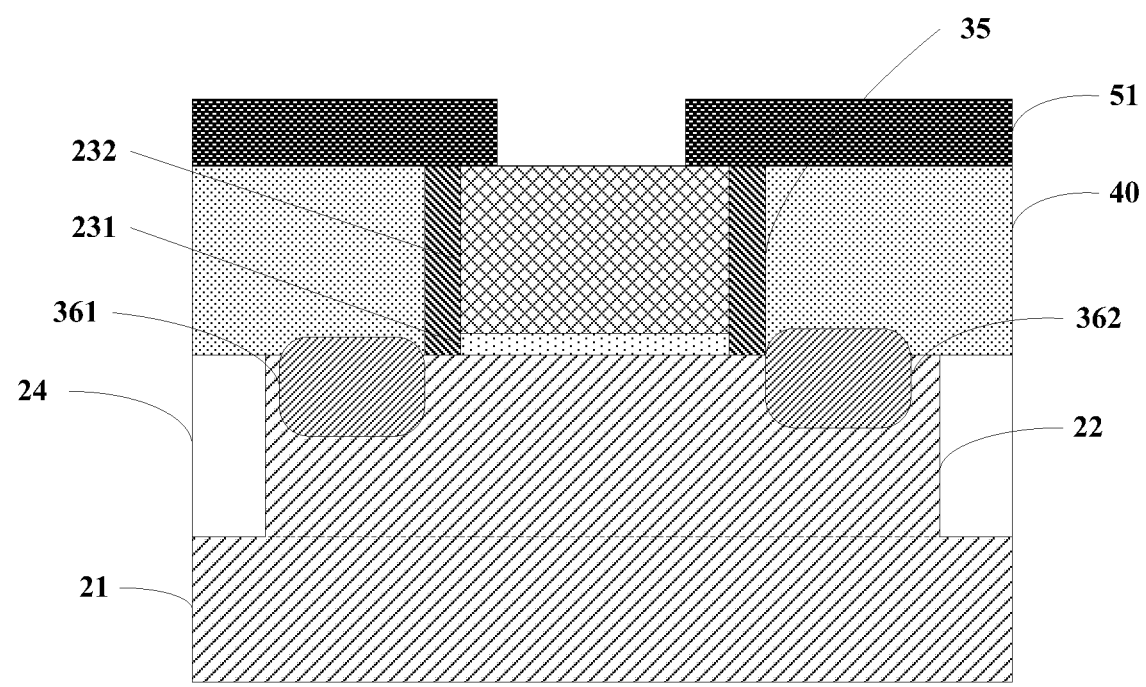
FIG. 5 is an exemplary cross sectional view of a structure in a stage of a process of manufacturing a semiconductor device.
Figure 6:
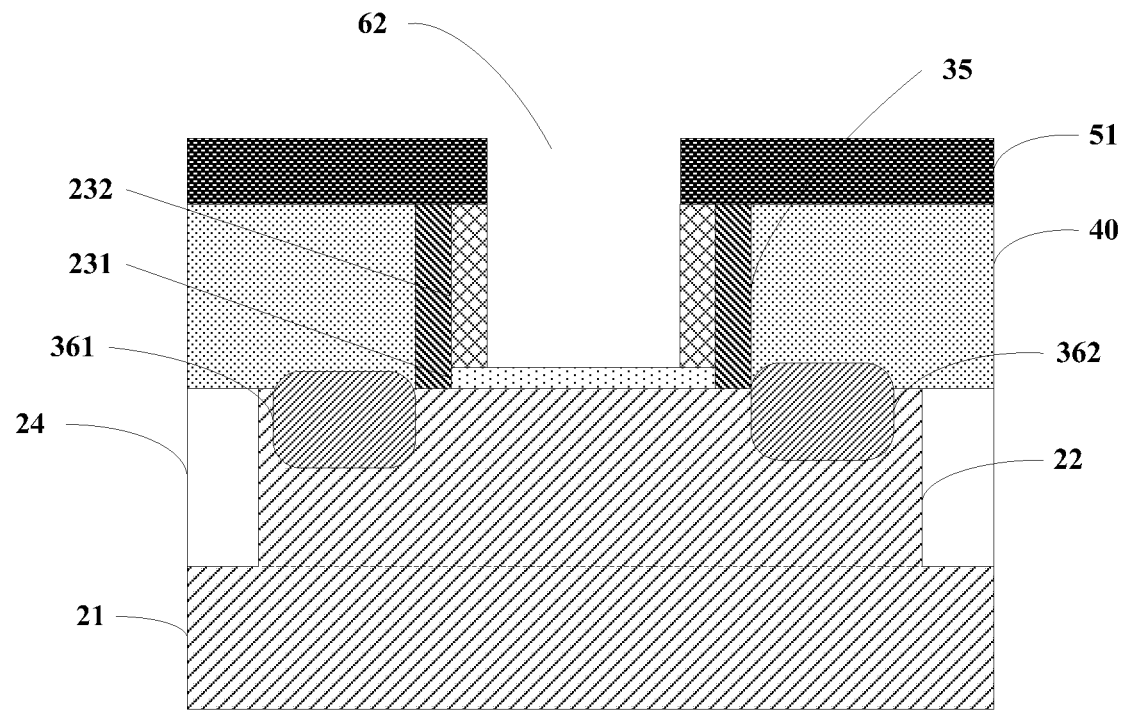
FIG. 6 is an exemplary cross sectional view of a structure in a stage of a process of manufacturing a semiconductor device.
Figure 7:
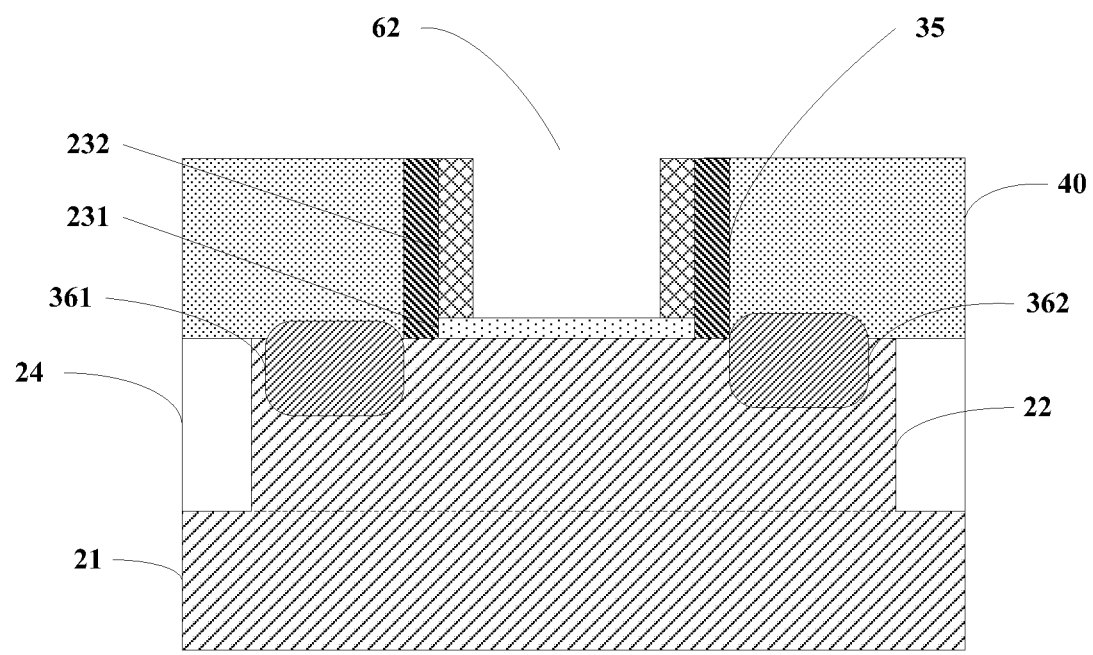
FIG. 7 is an exemplary cross sectional view of a structure in a stage of a process of manufacturing a semiconductor device.

FIG. 5 to FIG. 7 are exemplary cross sectional views of structures in several stages in step S104 in an implementation of a process of manufacturing a semiconductor device. A process of step S104 is described in detail below with reference to FIG. 5 to FIG. 7.

As shown in FIG. 5, a patterned mask layer (for example, a photoresist) 51 is formed on the structure shown in FIG. 4, and a part of the upper surface of the semiconductor layer 232 is exposed on the patterned mask layer 51. In this implementation, the middle part of the semiconductor layer is exposed on the mask layer 51 and the mask layer 51 covers the parts on two sides of the middle part of the semiconductor layer. In other implementations, the middle part and a part on one side of the middle part of the semiconductor layer may be exposed on the mask layer 51 and the mask layer 51 covers a part on the other side of the middle part of the semiconductor layer.

Subsequently, as shown in FIG. 6, the mask layer 51 serves as a mask, the semiconductor layer 232 is partially etched (for example, by using a dry etching process) to remove a part (for example, the middle part) of the semiconductor layer 232 to form an opening 62 on which the gate dielectric layer 231 is exposed, and a remaining part of the semiconductor layer 232 is on a side surface of the spacer layer. In this implementation, the remaining part of the semiconductor layer 232 is located on each side surface of two parts of the spacer layer 35. In other implementations, the remaining part of the semiconductor layer 232 may be located on a side surface of one part of the spacer layers 35.

Subsequently, the mask layer 51 is removed to form a structure shown in FIG. 7.

It should be noted that, in steps of FIG. 5 to FIG. 7, the remaining part of the semiconductor layer 232 is located on each side surface of the two parts of the spacer layer 35, but the scope of the present disclosure is not limited thereto. For example, the middle part and a part on one side of the middle part of the semiconductor layer may be removed, and only a part on the other side of the middle part is retained. That is, the remaining part of the semiconductor layer 232 is on only a side surface of one part of the spacer layer 35.

Returning to FIG. 1, in step S105, the opening is filled with a metal gate layer.

Figure 8:
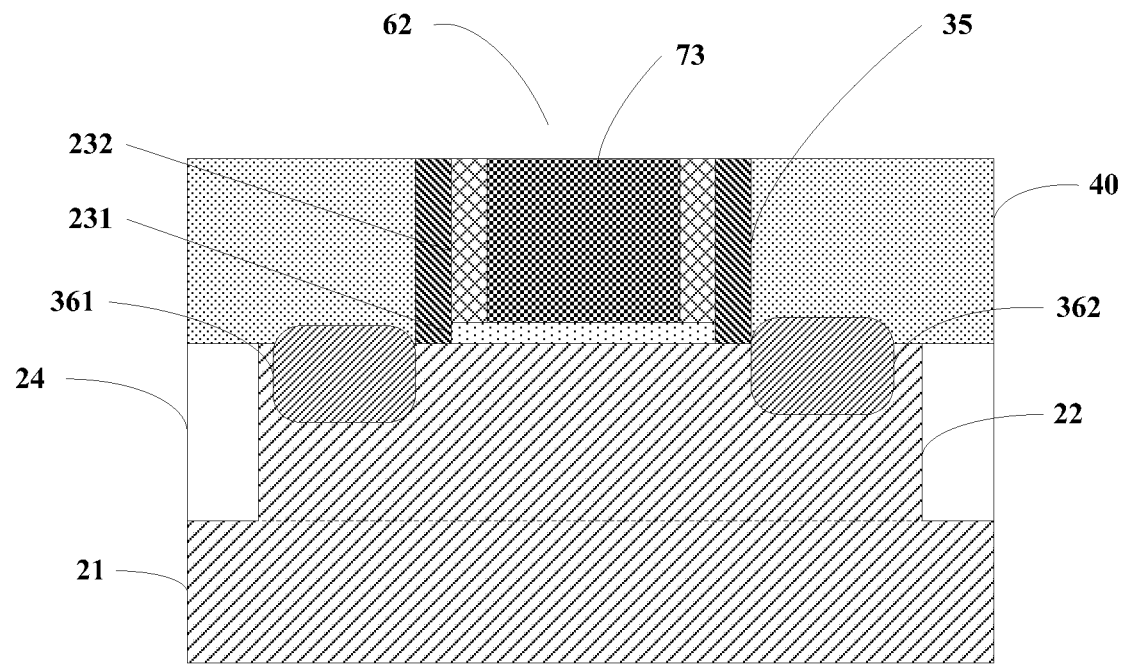
FIG. 8 is an exemplary cross sectional view of a structure in a stage of a process of manufacturing a semiconductor device.

FIG. 8 is an exemplary cross sectional view of a structure in step S105 in an implementation of a process of manufacturing a semiconductor device. As shown in FIG. 8, the opening 62 is filled with a metal gate layer 73 using, for example, a deposition process. In some implementations, a planarization process may further be performed on the metal gate layer. For example, the metal gate layer 73 may include metal such as tungsten. In some implementations, the remaining part of the semiconductor layer 232 is located on each side surface of two sides of the metal gate layer 73. A gate is formed in this step, and the gate includes the metal gate layer 73 on the gate dielectric layer 231 and the semiconductor layer 232 on a side surface of at least one side (for example, two sides) of the metal gate layer 73.

Hereto, implementations of a method for manufacturing a semiconductor device are provided. In the described implementations of the manufacturing method, the semiconductor layer is partially etched to remove the part of the semiconductor layer, so as to form the opening on which the gate dielectric layer is exposed. Subsequently, the opening is filled with the metal gate layer so that the formed semiconductor device includes the doped semiconductor layer on the side surface of at least one side of the metal gate layer. The conductivity type of the dopant included in the semiconductor layer is the opposite of the conductivity type of the semiconductor fin. This can improve a work function of the device, thereby improving a current characteristic of the device during a working process, reducing the SCE, and lowering a leakage current. In addition, implementations of the foregoing method can further effectively resolve the inconformity of a metal gate process in a small-sized device, and in particular, the edge effect.

According to forms of the foregoing manufacturing method, a semiconductor device is formed. As shown in FIG. 8, the semiconductor device may include: the semiconductor substrate 21; the semiconductor fin 22 on the semiconductor substrate 2; and the gate structure on the semiconductor fin 22. The gate structure may include the gate dielectric layer 231 on a part of the surface of the semiconductor fin 22 and the gate on the gate dielectric layer 231. The gate may include the metal gate layer 73 on the gate dielectric layer 231 and the semiconductor layer 232 on the side surface of at least one side of the metal gate layer 73. For example, the semiconductor layer 232 may be located on each side surface of two sides of the metal gate layer 73. A material of the semiconductor layer 232 may include polysilicon, amorphous silicon, or the like. The semiconductor layer 232 includes the dopant, and the conductivity type of the dopant is opposite to the conductivity type of the semiconductor fin 22.

In forms of this implementation, the semiconductor device includes the doped semiconductor layer on the side surface of at least one side of the metal gate layer, and the conductivity type of the dopant included in the semiconductor layer is the opposite of the conductivity type of the semiconductor fin. This can improve a work function of the device, thereby improving a current characteristic of the device during a working process, reducing the SCE, and lowering a leakage current. In addition, this can further effectively resolve the inconformity of a metal gate process in a small-sized device, and in particular, the edge effect.

In some implementations, the conductivity type of the semiconductor fin 22 may be N-type (that is, the semiconductor device may be a PMOS device), and the conductivity type of the dopant may be P-type. For example, the dopant may include boron. Therefore, for a PMOS device (the conductivity type of the semiconductor fin 22 is N-type), the conductivity type of the dopant is P-type (that is, the dopant is a P-type dopant). This can enable the Fermi level of the semiconductor layer 232 to be closer to a valence band, thereby increasing a work function of the PMOS device. A greater work function value of the PMOS device indicates a greater capability to improve a current characteristic of the device during a working process, reduce the SCE, and lower a leakage current, and the inconformity of a metal gate process in a small-sized device can be effectively resolved, and in particular, the edge effect.

In other implementations, the conductivity type of the semiconductor fin 22 may be P-type (that is, the semiconductor device may be an NMOS device), and the conductivity type of the dopant may be N-type (that is, the dopant is an N-type dopant). For example, the dopant may include phosphorus or arsenic. Therefore, for an NMOS device (the conductivity type of the semiconductor fin 22 is P-type), the conductivity type of the dopant is N-type. This can enable the Fermi level of the semiconductor layer 232 to be closer to a valence band, thereby decreasing a work function of the NMOS device. A smaller work function value of the NMOS device indicates a greater capability to improve a current characteristic of the device during a working process, reduce the SCE, and lower a leakage current, and the inconformity of a metal gate process in a small-sized device can be effectively resolved, and in particular, the edge effect.

In some implementations, a doping density of the dopant may range from $1\times10^{20}$ atoms/cm$^3$ to $1\times10^{21}$ atoms/cm$^3$. For example, the doping density of the dopant may be $3\times10^{20}$ atoms/cm$^3$, $5\times10^{20}$ atoms/cm$^3$, or $8\times10^{20}$ atoms/cm$^3$.

In some implementations, as shown in FIG. 8, the semiconductor device may further include the spacer layer 35 on each side surface of two sides of the gate structure. For example, the spacer layer 35 is located on a side surface of the semiconductor layer 232. As shown in FIG. 8, the semiconductor device may further include the inter-layer dielectric layer 40 surrounding the spacer layer 35 and the gate structure.

In some implementations, as shown in FIG. 8, the semiconductor device may further include the source 361 and the drain 362 that are respectively on two sides of the gate structure and at least partially located in the semiconductor fin 22. The spacer layer 35 isolates the source 361 and the drain 362 from the gate structure. A wider multilayer spacer layer can reduce parasitic capacitance between the source/drain and the gate. The conductivity type of the dopant of the semiconductor layer 232 is the same as conductivity types of the source 361 and the drain 362.

In some implementations, as shown in FIG. 8, the semiconductor device may further include the groove isolation portion 24 on the semiconductor substrate 21 that surrounds the semiconductor fin 22.

In some implementations, the manufacturing method may further include: before filling the opening with a metal gate layer, metalizing the remaining part of the semiconductor layer to form a metal silicide layer.

Figure 9:
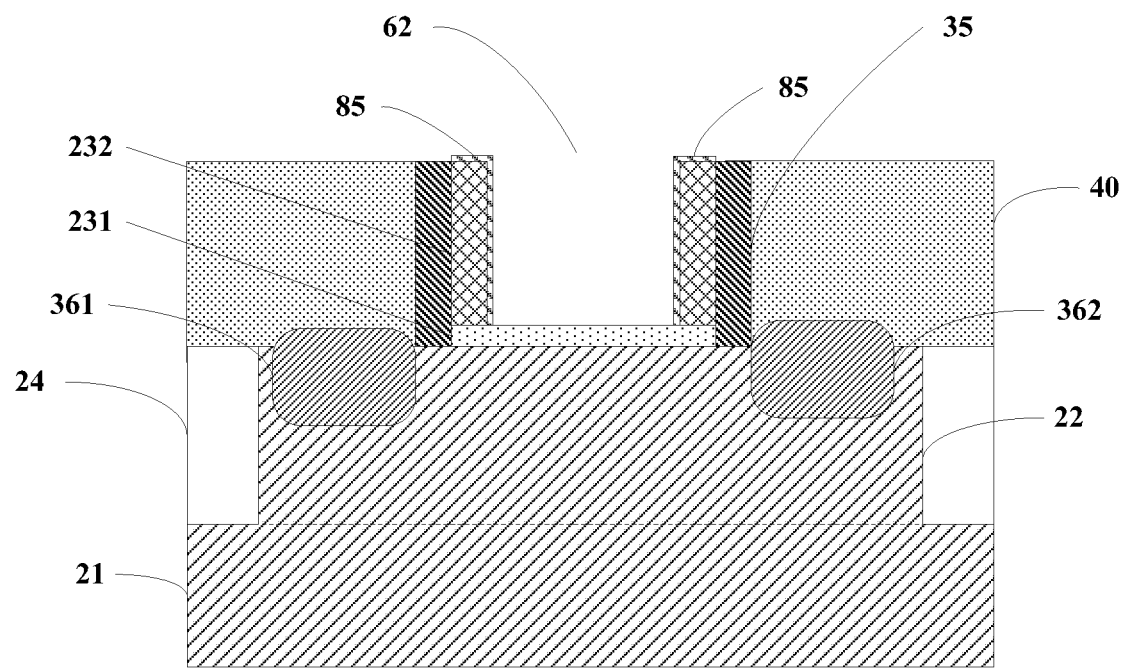
FIG. 9 is an exemplary cross sectional view of a structure in a stage of a process of manufacturing a semiconductor device.
Figure 10:
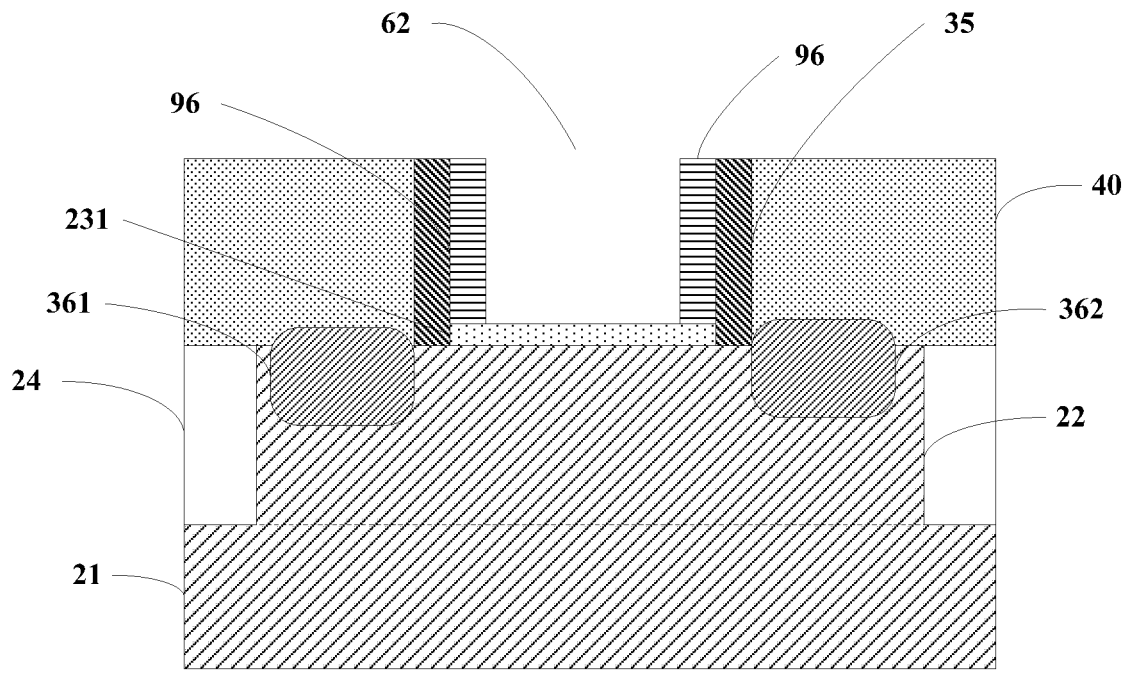
FIG. 10 is an exemplary cross sectional view of a structure in a stage of a process of manufacturing a semiconductor device.
Figure 11:
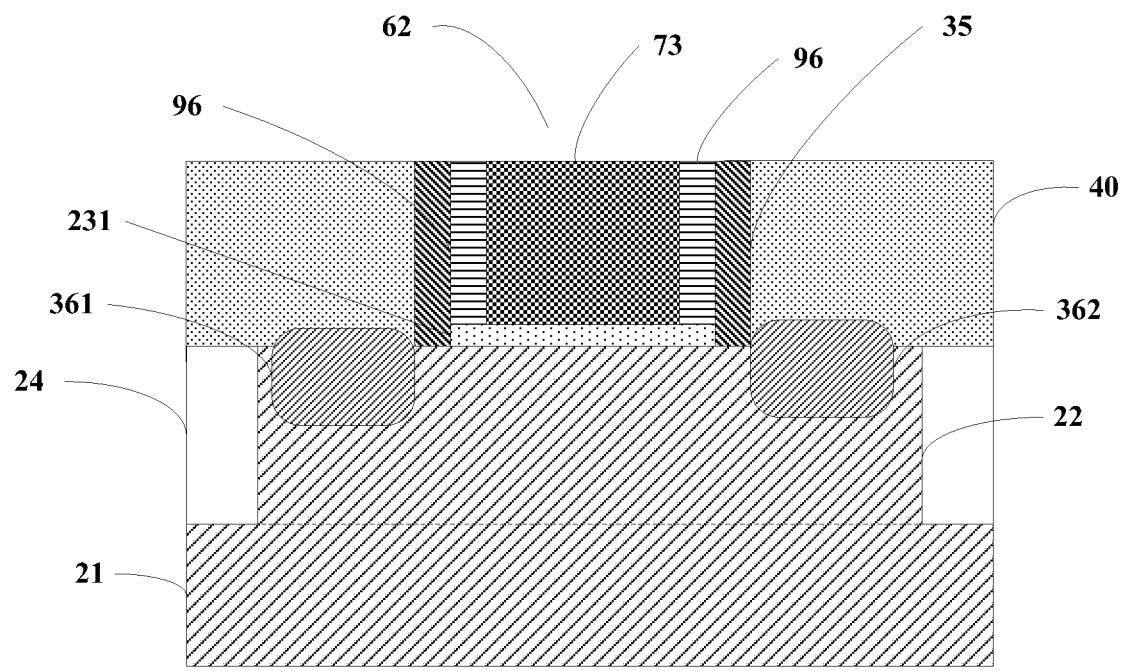
FIG. 11 is an exemplary cross sectional view of a structure in a stage of a process of manufacturing a semiconductor device.

FIG. 9 to FIG. 11 are exemplary cross sectional views of structures in several stages of a process of manufacturing the semiconductor device. Implementations of another form of a process of manufacturing a semiconductor device is described in detail below with reference to FIG. 9 to FIG. 11.

As shown in FIG. 9, after step S104 described above, a metal layer 85 is formed on the remaining part of the semiconductor layer (for example, polysilicon or amorphous silicon) 232 using, for example, a deposition process. For example, a material of the metal layer 85 may be nickel (Ni) or the like.

Subsequently, as shown in FIG. 10, heat treatment is performed on the structure shown in FIG. 9, so that the remaining part of the semiconductor layer 232 reacts with the metal layer 85 to form a metal silicide layer 96. For example, the temperature of the heat treatment may range from 300° C. to 400° C. For example, a material of the metal silicide layer 96 may include NiSi or the like.

Forms of the foregoing implementations utilize a process of metalizing the remaining part of the semiconductor layer 232 to form the metal silicide layer 96.

Subsequently, as shown in FIG. 11, the opening 62 is filled with the metal gate layer 73.

Above, additional implementations of a method for manufacturing a semiconductor device are provided. In these implementations, after the opening is formed by partially etching the semiconductor layer, the remaining part of the semiconductor layer is metalized to form the metal silicide layer. Subsequently, the opening is filled with the metal gate layer. Metalizing the remaining part of the semiconductor layer to form the metal silicide layer can further improve a work function of the semiconductor device, thereby further improving a current characteristic of the device during a working process, reducing the SCE, and lowering a leakage current, and the inconformity of a metal gate process in a small-sized device can be further effectively resolved, and in particular, the edge effect.

In implementations of the foregoing manufacturing method, a semiconductor device is formed. As shown in FIG. 11, the semiconductor device may include: the semiconductor substrate 21; the semiconductor fin 22 on the semiconductor substrate 2; and the gate structure on the semiconductor fin 22. The gate structure may include the gate dielectric layer 231 on a part of the surface of the semiconductor fin 22 and the gate on the gate dielectric layer 231. The gate may include the metal gate layer 73 on the gate dielectric layer 231 and the metal silicide layer 96 on the side surface of at least one side of the metal gate layer 73. For example, the metal silicide layer 96 may be located on each side surface of two sides of the metal gate layer 73. For example, the material of the metal silicide layer 96 may include NiSi. The metal silicide layer 96 includes the dopant, and the conductivity type of the dopant is opposite to the conductivity type of the semiconductor fin 22.

In foregoing implementations, the semiconductor device includes the metal silicide layer on the side surface of at least one side of the metal gate layer, and the conductivity type of the dopant included in the metal silicide layer is the opposite of the conductivity type of the semiconductor fin. This can further improve a work function of the device, thereby improving a current characteristic of the device during a working process, reducing the SCE, and lowering a leakage current. In addition, this can further effectively resolve the inconformity of a metal gate process in a small-sized device, and in particular, the edge effect.

In some implementations, the conductivity type of the semiconductor fin 22 may be N-type (that is, the semiconductor device may be a PMOS device), and the conductivity type of the dopant may be P-type. For example, the dopant may include boron.

In other implementations, the conductivity type of the semiconductor fin 22 may be P-type (that is, the semiconductor device may be an NMOS device), and the conductivity type of the dopant may be N-type. For example, the dopant may include phosphorus or arsenic.

In some implementations, a doping density of the dopant may range from $1\times10^{20}$ atoms/cm$^3$ to $1\times10^{21}$ atoms/cm$^3$. For example, the doping density of the dopant may be $3\times10^{20}$ atoms/cm$^3$, $5\times10^{20}$ atoms/cm$^3$, or $8\times10^{20}$ atoms/cm$^3$.

In some implementations, as shown in FIG. 11, the semiconductor device may further include: a spacer layer 35 on each side surface of two sides of the gate structure; and an inter-layer dielectric layer 40 surrounding the spacer layer 35 and the gate structure.

Similar to the semiconductor device shown in FIG. 8, the semiconductor device shown in FIG. 11 may further include the source 361, the drain 362, the groove isolation portion 24, and the like. These structures are described in detail above, and no further details are provided herein again.

Figure 12A:
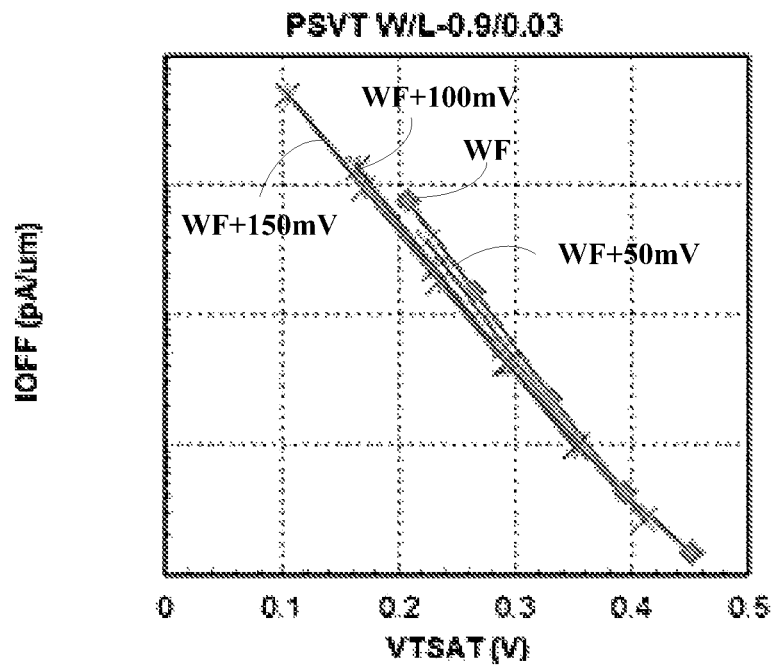
FIG. 12A is a curve diagram of a relationship between a leakage current and a working threshold voltage during a working process of a semiconductor device according to some forms of the present disclosure.
Figure 12B:
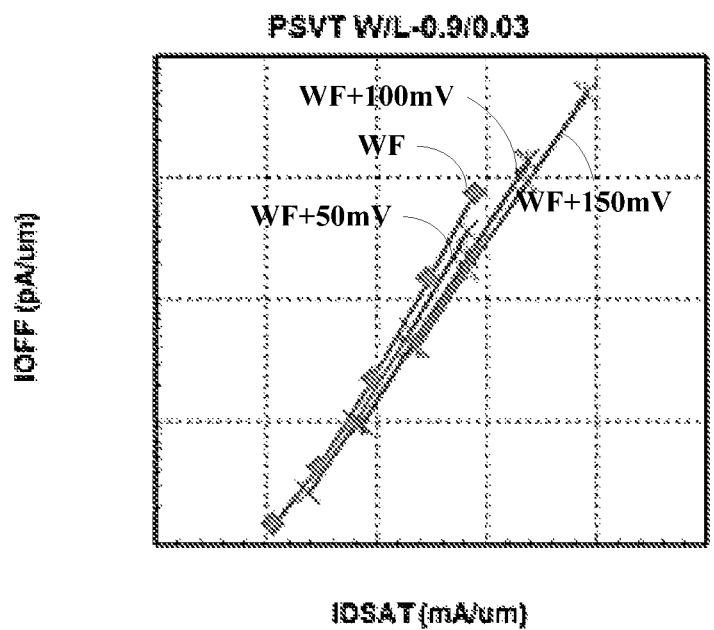
FIG. 12B is a curve diagram of a relationship between a leakage current and a working current during a working process of a semiconductor device according to some forms of the present disclosure.
Figure 12C:
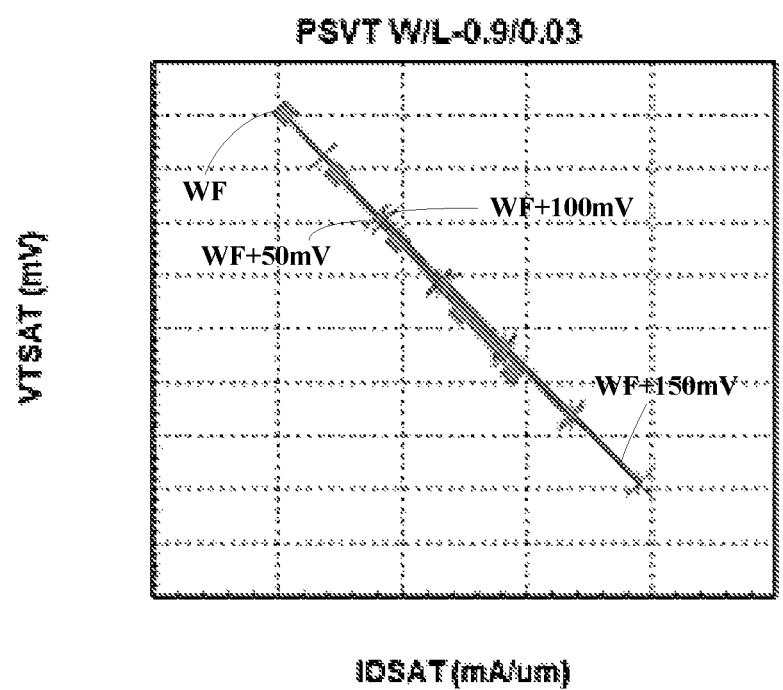
FIG. 12C is a curve diagram of a relationship between a working threshold voltage and a working current during a working process of a semiconductor device according to some forms of the present disclosure.

FIG. 12A to FIG. 12C are curves of working characteristics of a semiconductor device according to some implementations of the present disclosure. PSVT represents a PMOS device; WF represents a threshold voltage corresponding to a work function of the semiconductor device; WF+50 mV represents that the threshold voltage corresponding to the work function of the semiconductor device is improved by 50 mV (that is, increased by 50 mV); WF+100 mV represents that the threshold voltage corresponding to the work function of the semiconductor device is improved by 100 mV (that is, increased by 100 mV); WF+150 mV represents that the threshold voltage corresponding to the work function of the semiconductor device is improved by 150 mV (that is, increased by 150 mV); IOFF represents a leakage current of the semiconductor device; VTSAT represents a working threshold voltage of the semiconductor device; and IDSAT represents a working current of the semiconductor device. Working characteristics of the semiconductor device are described below with reference to FIG. 12A to FIG. 12C.

FIG. 12A is a curve diagram of a relationship between a leakage current (IOFF) and a working threshold voltage (VTSAT) during a working process of a semiconductor device according to some implementations of the present disclosure. As can be learned from FIG. 12A, a more greatly-improved work function of the semiconductor device indicates a weaker leakage current in the case of the same working threshold voltage, and therefore, the semiconductor device has better performance.

FIG. 12B is a curve diagram of a relationship between a leakage current (IOFF) and a working current (IDSAT) during a working process of a semiconductor device according to some implementations of the present disclosure. As can be learned from FIG. 12B, a more greatly-improved work function of the semiconductor device indicates a weaker leakage current and a stronger working current, and therefore, the semiconductor device has better performance.

FIG. 12C is a curve diagram of a relationship between a working threshold voltage (VTSAT) and a working current (IDSAT) during a working process of a semiconductor device according to some implementations of the present disclosure. As can be learned from FIG. 12C, a more greatly-improved work function of the semiconductor device indicates a stronger working current in the case of the same working threshold voltage, and therefore, the semiconductor device has better performance.

As can be learned from the foregoing curve diagrams of relationships, a more greatly-improved work function of the semiconductor device (for example, the PMOS device has a greater work function or the NMOS device has a smaller work function) indicates a weaker leakage current and a better characteristic of a working current of the device, so that the SCE can be reduced and the performance of the semiconductor device can be improved.

Hereto, implementations of methods for manufacturing a semiconductor device and implementations of formed semiconductor devices according to the present disclosure are described in detail. To avoid obscuring the concept of the present disclosure, some details known in the art are not described. Based on the foregoing descriptions, a person skilled in the art will understand how to implement the technical solution disclosed herein.

Although some particular embodiments and implementations of the present disclosure have been described in detail by using examples, a person skilled in the art will understand that the foregoing examples are merely for the purpose of description and are not intended to limit the scope of the present disclosure. A person skilled in the art will understand that the foregoing embodiments and implementations may be modified without departing from the scope and spirit of the present disclosure. The scope of the present disclosure is subjected to the appended claims.

What is claimed is:

1. A semiconductor device, comprising:
   a semiconductor substrate;
   a semiconductor fin positioned on the semiconductor substrate; and
   a gate structure positioned on the semiconductor fin;
   wherein the gate structure comprises a gate dielectric layer on a part of a surface of the semiconductor fin and a gate on the gate dielectric layer;
   wherein the gate comprises a metal gate layer on the gate dielectric layer and a semiconductor layer on a side surface of at least one side of the metal gate layer; and
   wherein the semiconductor layer comprises a dopant, where a conductivity type of the dopant is the opposite of a conductivity type of the semiconductor fin.

2. The semiconductor device according to claim 1, wherein:
   the conductivity type of the semiconductor fin is N-type, the conductivity type of the dopant is P-type, and the dopant comprises boron; or
   the conductivity type of the semiconductor fin is P-type, the conductivity type of the dopant is N-type, and the dopant comprises phosphorus or arsenic.

3. The semiconductor device according to claim 1, wherein a doping density of the dopant ranges from $1 \times 10^{20}$ atoms/cm$^3$ to $1 \times 10^{21}$ atoms/cm$^3$.

4. The semiconductor device according to claim 1, wherein the semiconductor layer is located on each side surface of two sides of the metal gate layer.

5. The semiconductor device according to claim 1, wherein a material of the semiconductor layer comprises polysilicon or amorphous silicon.

6. The semiconductor device according to claim 1, further comprising:
   a spacer layer on each side surface of two sides of the gate structure; and
   an inter-layer dielectric layer surrounding the spacer layer and the gate structure.

* * * * *